Figure 1:
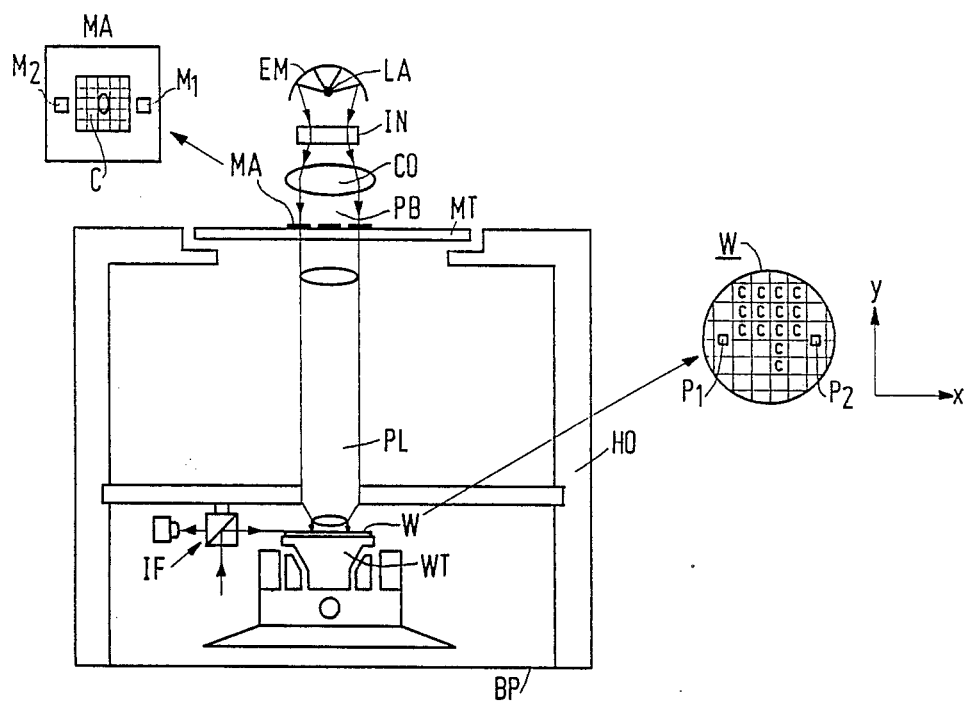

United States Patent [19]

van den Brink et al.

[11] Patent Number: 4,778,275

[45] Date of Patent: Oct. 18, 1988

[54] METHOD OF ALIGNING A MASK AND A SUBSTRATE RELATIVE TO EACH OTHER AND ARRANGEMENT FOR CARRYING OUT THE METHOD

[75] Inventors: Martinus A. van den Brink, Veldhoven; Jan van Eijk, Eindhoven, both of Netherlands

[73] Assignees: U.S. Philips Corp.; ASM Lithography, both of New York, N.Y.

[21] Appl. No.: 910,710

[22] Filed: Sep. 24, 1986

[30] Foreign Application Priority Data

Mar. 12, 1986 [NL] Netherlands ............... 8600639

[51] Int. Cl.[4] ............................................. G01B 11/00
[52] U.S. Cl. ..................................... 356/401; 356/150
[58] Field of Search ..................... 356/150, 400, 401

[56] References Cited

U.S. PATENT DOCUMENTS 4,062,623 12/1977 Suzuki et al. ....................... 356/401
4,251,160 2/1981 Bouwhuis et al. .................. 356/150
4,573,791 3/1986 Phillips ............................... 356/401

OTHER PUBLICATIONS

"Automatic Alignment System for Optical Projection Printing" Bouwhuis et al, IEEE Transactions on Electron Devices, vol. Ed 26, #4, 4/1979.

Primary Examiner—R. A. Rosenberger
Assistant Examiner—Crystal D. Cooper
Attorney, Agent, or Firm—Robert T. Mayer

[57] ABSTRACT

A method and an arrangement for aligning relative to each other a mask pattern (C) and a substrate (W) which are both provided with two alignment marks wherein by using two separate alignment systems ($AS_1$, $AS_2$) which are each associated with one mask mark ($M_1$, $M_2$) and which are each used for aligning the substrate marks ($P_1$, $P_2$) relative to said mask marks the substrate (W) and the mask (M) can be aligned accurately without referring to the frame of the exposure apparatus and in addition it is possible to detect magnification errors.

20 Claims, 4 Drawing Sheets

METHOD OF ALIGNING A MASK AND A SUBSTRATE RELATIVE TO EACH OTHER AND ARRANGEMENT FOR CARRYING OUT THE METHOD

The invention relates to a method of aligning relative to each other a mask pattern formed in a mask and a substrate on which said mask pattern is to be imaged, using alignment marks present in the mask and in the substrate, a first substrate mark being aligned relative to a first mask mark and a second substrate mark being aligned relative to the first mask mark, which alignments are effected by means of the lens system with which the mask pattern is imaged onto the substrate. The invention also relates to an arrangement for carrying out this method.

Such a method and arrangement are known from U.S. Pat. No. 4,251,160. This Patent describes an apparatus for repeatedly and to a reduced scale imaging a mask pattern, for example the pattern of an integrated circuit (IC) on the same substrate, the mask pattern and the substrate being moved relative to each other along two mutually perpendicular directions in a plane parallel to the substrate plane and the mask plane in the interval between two succeeding exposures.

Integrated circuits are fabricated by means of diffusion and masking techniques. A plurality of masks with different mask patterns are then imaged in succession at the same location on a semiconductor substrate. Between succeeding imagings at the same locations the substrate should be subjected to the desired physical and chemical changes. For this purpose, after the substrate has been exposed by a mask pattern it must be removed from the apparatus and after it has been subjected to the desired process steps it should be replaced therein in the same position in order to be exposed by means of a second mask pattern etc., care being taken that the image of the second mask pattern and the succeeding mask patterns is positioned accurately relative to the substrate.

Diffusion and masking techniques may also be employed in the fabrication of other structures with details of the order of magnitude of micrometers. Examples of this are structures of integrated optical systems or guiding and detection patterns of magnetic-domain memories. In the fabrication of such structure it is also necessary to align images of mask patterns very accurately relative to a substrate.

In view of the multitude of electronic components per unit area of the substrate and the resulting small dimensions of these components increasingly stringent requirements are imposed on the accuracy with which integrated circuits are fabricated. The locations where the successive masks should be imaged onto the substrate should therefore be defined with increasing accuracy.

U.S. Pat. No. 4,251,160 describes an arrangement for aligning a substrate relative to a mask pattern, wherein an alignment mark in the substrate is imaged onto an alignment in the mask, outside the mask pattern to be imaged. The alignment marks in the substrate and in the mask are diffraction gratings. If the image of the substrate mark coincides accurately with the mask alignment mark the substrate is aligned correctly relative to the mask pattern. The principal element for imaging the substrate mark on the mask mark is the projection-lens system or imaging system by which the mask pattern is imaged onto the substrate.

For the desired very high positioning accuracy, within some tenths of one micrometer of the image of the mask pattern relative to the substrate it is not sufficient to align this substrate and mask-pattern image only locally in two mutually perpendicular X and Y directions parallel to the mask plane and the substrate plane, an angular alignment of the substrate and the mask-pattern image being also necessary. Therefore, in the known arrangement a first substrate mark is aligned relative to a first mask mark. Thus, the substrate is positioned correctly at the location of the first substrate mark. Subsequently, the substrate is moved in the X-direction over a distance equal to the distance between the first substrate mark and the second substrate mark and care is taken that the second substrate mark is aligned relative to the first mask mark. For this purpose the substrate may be rotated effectively about an axis perpendicular to the substrate plane and through the center of the mask image. The effective rotation may be a combination of a rotation about an axis and a displacement transverse to this axis. The displacement of the substrate and the substrate table is measured by means of, for example, an interferometer system which employs the frame of the exposure apparatus or a part of this frame as its reference. The angular orientation of the substrate is thus related to the frame of the exposure apparatus.

For positioning the mask pattern at the correct angle a second mask mark is imaged onto the first mask mark by a separate optical system. Care is taken that lines of the image of the second mask mark which extend in the X-direction coincide with lines of the first mask mark which extend in the X-direction. The X-direction is the direction in which the substrate is moved during alignment of the two substrate marks relative to the first mask mark, which X-direction is referred to the frame of the exposure apparatus by the interferometer system. Thus, in the known arrangement the angular orientation of the mask is also related to the frame and, consequently, the angular orientation of the mask and the substrate relative to one another is determined by this frame. This imposes stringent requirements on the stability of the frame, specifically on the thermal stability, but also on the freedom from creep of the frame. In this respect creep is to be understood to mean the continuous deformation of a material under load in the long term.

The exposure apparatus for the repeated imaging of mask patterns in accordance with the U.S. Pat. No. 4,251,160 has proved to be very suitable for use in the fabrication of integrated circuits with minimal details, or line widths, of the order of one micrometer or more. The increasing demand for more electronic components per unit area of the substrate, with ever even smaller dimensions of these components, has lead to a growing need for an apparatus which is capable of repeatedly making images whose details or line widths are smaller than one micrometer.

The projection-lens system or imaging system for such an apparatus by means of which the mask pattern is imaged onto the substrate and which is also employed for imaging the substrate marks on the mask mark should have a very high resolution, whilst the image field should be comparatively large, for example, of a diameter of the order of 23 mm. When such a projection-lens system is employed a problem which until now was not serious may play an important part, namely the problem that the behaviour of the projection-lens system depends on ambient influences. In the case of varying ambient parameters, specifically air pressure, the relative refractive indices in the projection-lens system may change to such an extent that the magnification of this system changes. Thus, the need arises to detect the magnification error in order to provide a correction for this.

In addition to the magnification error which arises as a result of deviation in the projection-lens system itself, it is also possible that during imaging of the mask pattern onto the substrate magnification errors arise as a result of dimensional variations in the mask pattern caused by temperature variations and mask deformations and as a result of thermal expansion of the suspensions of the projection-lens system and the mask in the exposure apparatus. Moreover, dimensional variations in the substrate, which also play a part in the known apparatus, still exert a substantial influence on the quality of the mask-pattern image.

It is the object of the present invention to provide method and arrangement for aligning a mask pattern relative to a substrate in which the relative angular orientation of the mask pattern and the substrate is determined directly by optical means and no longer by the frame of the exposure apparatus, and in which the magnification with which the projection-lens system images the mask pattern onto the substrate is determined optically. In accordance with a first aspect of the invention the method is characterized in that, in addition, at least one substrate mark is aligned relative to a second mask mark using the said lens system.

This method, which is referred to as a two-point alignment method, in which at least three separate alignments are performed, enables at least six parameters involved in mask-pattern imaging to be determined using the displacement-measuring system for the substrate. These parameters are the local position in two directions of the mask-pattern image on the substrate, the image size of this mask-pattern image, the distance between the substrate marks, the angular orientation of the mask-pattern image on the substrate, and the angular orientation of the substrate. The two last-mentioned parameters define the angular orientation of the mask-pattern image relative to the substrate. These six parameters are employed for positioning the mask-pattern image not only in two directions but also its angular relationship relative to the substrate. Moreover, the resulting information enables the size of the image of the mask pattern to be adapted to the scale of the substrate, which scale is dictated by the distance between the centres of two substrate marks which are situated on opposite sides outside the area on the substrate where the mask pattern is to be imaged repeatedly. These two substrate marks are employed to define the position and the size of the mask-pattern image before repeated imaging is started.

Alignment is also possible by means of three instead of two substrate marks. Two of the substrate marks are then arranged adjacent a first side of and outside the area in which the mask pattern is to be imaged repeatedly, namely at such a distance from one another that they are imaged simultaneously on the two associated mask marks. The third substrate mark is then situated adjacent a second side opposite the first side of and outside said area and is aligned after the substrate and the mask have been displaced relative to one another, in such a way that one of the mask marks is imaged on this third substrate mark. This enables the six parameters to be determined in only two successive alignment steps.

However, in many cases it is required to have a greater freedom in respect of the choice of the positions and the number of substrate gratings. Therefore, the method in accordance with the invention is preferably characterized further in that the individual alignments follow each other in time. Between the alignment steps the substrate may be moved under control of its displacement system in order to position a following substrate mark opposite a mask mark. Thus, only two substrate marks are needed and, moreover, no additional requirements have to be imposed on the size of the image field of the projection-lens system.

The two or three substrate marks are employed to define a first direction in which, during the repeated exposure, the substrate and the mask are moved relative to one another. The second direction of movement is then the direction perpendicular to the first direction.

An alignment method in which the two directions of movement need not be perpendicular is characterized further in that two additional substrate marks are aligned relative to the two mask marks. This method provides the additional possibility of detecting deformations along an axis which extends obliquely relative to the X-direction of movement and of correcting for these deformations during repeated exposure. When even more substrate marks are employed it is also possible to correct for further non-linear deformations or irregularities in the substrate.

The invention is not only suitable for the non-repeated alignment of the entire substrate by means of substrate marks which are situated outside the area in which a plurality of images of the mask pattern must be formed but also for the repeated alignment of this substrate each time before a mask pattern is imaged. To this end the method in accordance with the invention is characterized further in that substrate marks situated within the substrate area and between sub-areas in each of which a mask pattern is to be imaged are aligned relative to the mask marks.

In accordance with a second aspect of the invention the arrangement for carrying out the alignment method, which arrangement comprises a first optical alignment system for aligning a first mask mark relative to substrate marks, which alignment system comprises a radiation source producing an alignment beam, a lens system for imaging a substrate mark and the first mask mark onto each other, and a radiation-sensitive detection system in the path of the alignment beam which has interacted with both the substrate mark and the first mask mark, the output signal of the detection system being a measure of the position of said alignment mark relative to each other, is characterized in that there is provided a second analogous optical alignment system for aligning a second mask mark and a substrate mark relative to each other, the lens system being common to the first and the second alignment system. In this respect analogous is to be understood to mean that the second alignment system has the same function as, and operates in a way analogous to, the first alignment system, minor differences between the elements of the two systems being possible.

Thus, there is a separate alignment system for each of the two mask marks. If used in conjunction with two substrate marks these alignment systems are used after each other and not simultaneously, whilst moreover the substrate is shifted relative to the mask when changing over from one alignment system to the other. Since the substrate marks are not imaged simultaneously, the use of the alignment arrangement is not limited by the size of the image field of the projection-lens system.

The apparatus in accordance with the invention may therefore be characterized further in that the distance between the optical axes of the two alignment systems is variable. This enables this arrangement to be used in conjunction with various versions of the projection-lens system having object fields of different sizes and in conjunction with various masks having different distances between the mask marks.

It is to be noted that European Patent Application No. 0,164,165 describes an apparatus comprising two optical alignment systems for positioning a substrate relative to reference axes. However, this apparatus serves for prealigning this substrate before the substrate is brought in an apparatus for exposing the substrate through a mask pattern. In said apparatus the substrate marks are not imaged on the mask marks but they are imaged directly on radiation-sensitive detectors. The two alignment systems of the known apparatus do not have a common projection-lens system.

Further, German Offenlegungsschrift No. 3,242,002 describes an arrangement for aligning a mask pattern relative to a substrate, which arrangement comprises two separate optical alignment systems. However, each of these alignment systems is associated with one substrate mark and is employed only for aligning this mark relative to the mask mark associated only with this substrate mark. For both alignment systems only one radiation source is provided and the beam produced by this source is alternately routed into one of the alignment systems by a rotating mirror.

A preferred embodiment is characterized further in that the substrate marks comprise phase-diffraction gratings and the marks comprise amplitude-diffraction gratings.

As is described in U.S. Pat. No. 4,251,160 periodic gratings, as compared with other alignment marks such as for example square marks or stripes which intersect each other perpendicularly, have the advantage that when positional errors are measured they are averaged over the gratings. This enables an accurate alignment to be obtained, even if one or more grating lines are missing or when the grating lines are serrated lines instead of straight lines. Especially in the fabrication of integrated circuits substrate gratings have the advantage that they cannot grow asymmetrically or become filled up during the consecutive diffusion processes, as would be possible when other alignment marks, for example squares, were used. The substrate gratings need only be provided once in the entire fabrication cycle of an integrated circuit and need not be formed again for every newly deposited layer. In comparison with amplitude gratings, phase gratings on the substrate have the advantage that they remain distinctly "visible". Moreover, the phase gratings can effectively withstand the multitude of diffusion processes to which the substrate is to be subjected during the fabrication of integrated circuits.

A preferred embodiment of the invention may be characterized further in that in each of the optical alignment systems in the radiation path of the alignment beam between the lens system and the radiation-sensitive detection system there are arranged means controlled by periodic signals for periodically moving a mask mark observed by the detection system and the image on this mask mark of a substrate mark relative to each other. In the case of grating marks the displacement is of the order of half a period of the mask grating.

This means controlled by the periodic signal may comprise drive means for the mask, which cause the mask mark to be moved periodically, or a polarisation modulator in conjunction with polarisation-sensitive elements which ensure that the image of the substrate mark is effectively moved over a mask mark. Periodically moving the substrate-mark image observed by the detection system relative to the mask mark provides a dynamic alignment signal and gives a substantial improvement of the alignment accuracy.

When the alignment marks are gratings the substrate gratings split the incident alignment beam into a plurality of subbeams of different diffraction orders, namely a zero-order subbeam, a plurality of first-order subbeams and a plurality of second-order and higher-order subbeams. In principle, only the lower-order subbeam can be used for imaging a substrate grating.

However, preferably the arrangement in accordance with the invention is characterized further in that in each of the optical alignment systems in the radiation path of the alignment beam between the mask and the detection system a second lens system is arranged for imaging the pupil of the lens system which is common to the two alignment systems, and in that a diaphragm is arranged in the plane of the pupil image, which diaphragm has apertures at the locations of incidence of beam portions which comprise these components of subbeams diffracted in the first diffraction orders by a substrate grating which are diffracted in the zero and first orders by a mask grating.

As a result of the use of the diaphragm, also referred to as an order diaphragm, the contrast of the image of a substrate grating is enhanced, disturbances in a substrate grating and in a mask grating hardly affect the resulting alignment signal, and the accuracy with which a substrate grating can be aligned relative to a mask grating is twice as large as in the absence of this order diaphragm.

Preferably, the arrangement in accordance with the invention is characterized further in that in each of the optical alignment systems in the radiation path of the alignment beam between the lens system and the mask mark an optical correction element is arranged for correcting the size and the axial position of the substrate-mark image formed by this lens system.

The invention will now be described in more detail, by way of example, with reference to the drawings.

Figure 2:
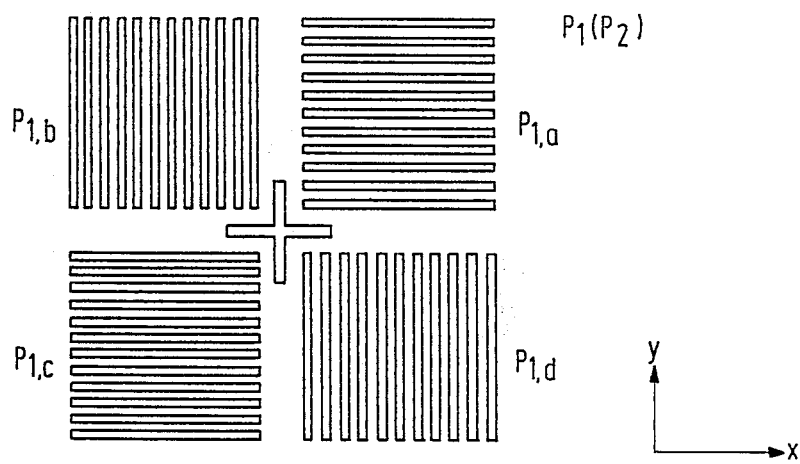
Figure 3:
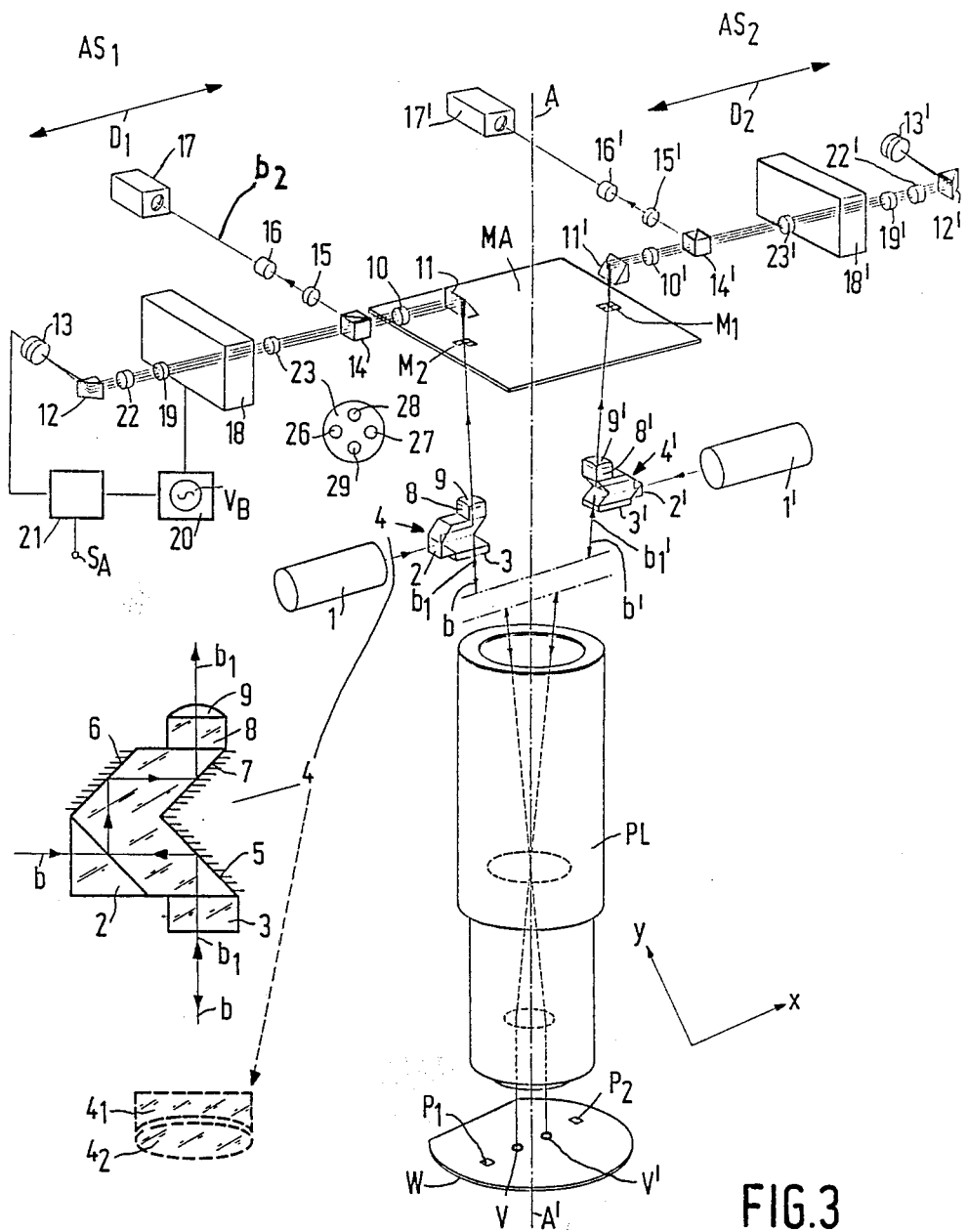
Figure 6:
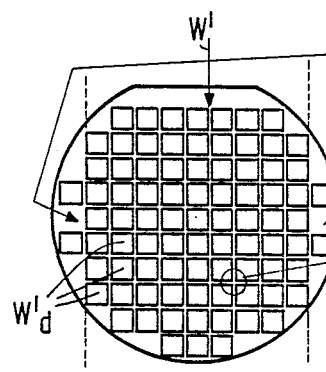
Figure 7:
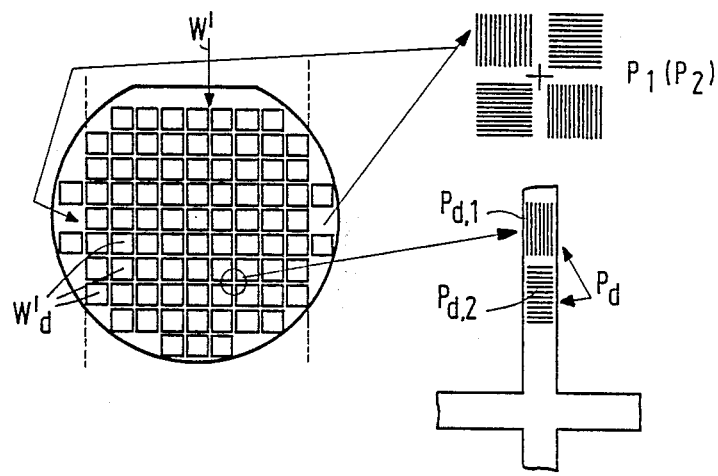
Figure 7:
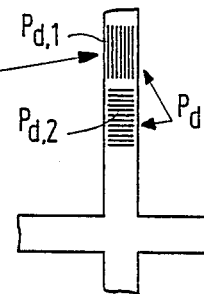
Figure 8:
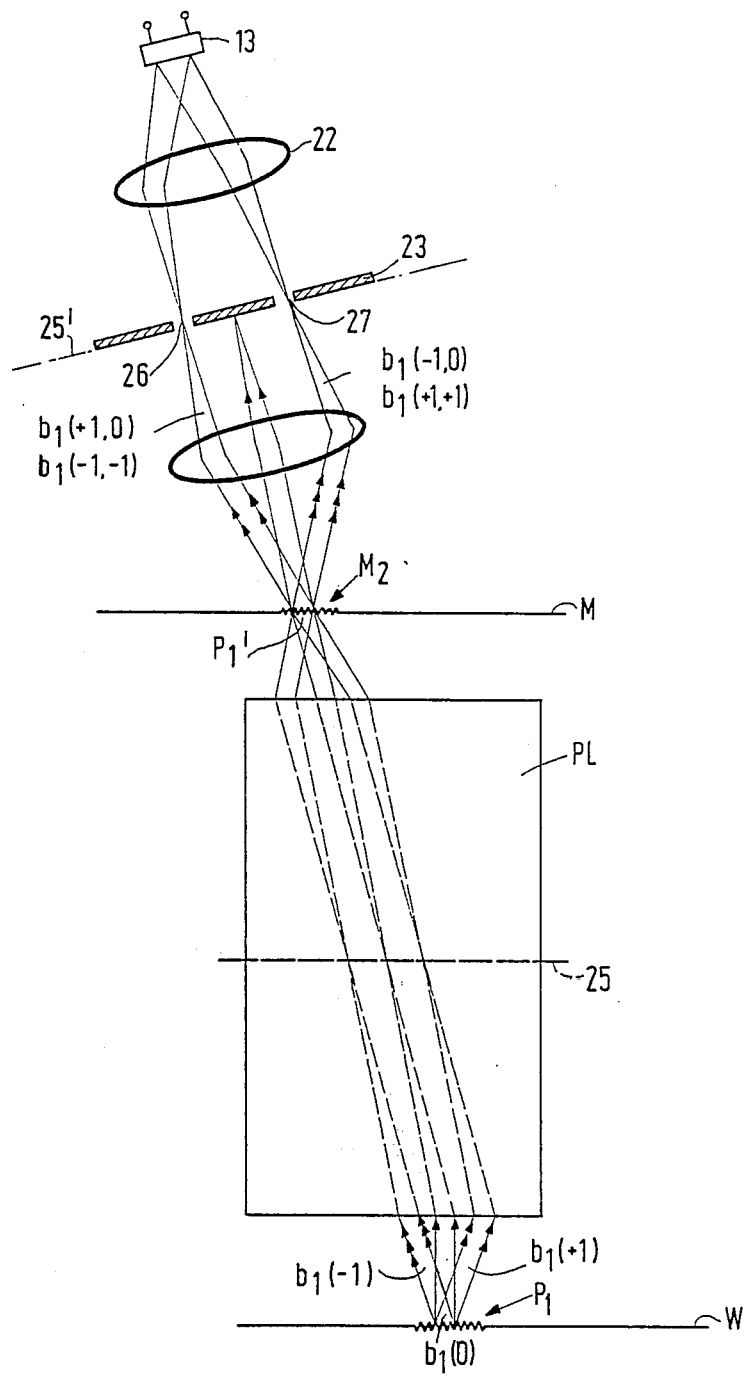

In the drawings:

FIG. 1 shows a known apparatus for the repeated imaging of a mask pattern onto a substrate, FIG. 2 shows a known alignment mark in the form of a two-dimensional grating, FIG. 3 shows an alignment arrangement in accordance with the invention, FIGS. 4, 5, 6 and 7 schematically illustrate the principle of and modifications to the alignment method in accordance with the invention, and FIG. 8 illustrates the operation of an order diaphragm in an optical alignment system.

FIG. 1 shows a known apparatus for the repeated imaging of a mask pattern onto a substrate. The principle parts of this apparatus are a projection column, in which a pattern C to be imaged is mounted, and a movable substrate table WT by means of which the substrate can be positioned relative to the mask pattern C.

The projection column incorporates an illumination system which may comprise a lamp LA, for example a mercury lamp, an elliptical mirror EM, an element IN, also referred to as integrator, which ensures an homogeneous radiation distribution within the projection beam PB and a condensor lens CO. The beam PB illuminates the mask pattern C in the mask M, which mask is arranged on a mask table MT.

The beam PB issuing from the mask pattern C traverses a projection lens system PL, shown schematically, which is arranged in the projection column and which forms an image of the pattern C on the substrate W. The projection lens system, for example, has a magnification of M = 1/5, a numerical aperture N.A. = 0.38, and a diffraction-limited image field of 23 mm diameter.

The substrate W is arranged on a substrate table WT, which is supported by for example an air-cushion. The projection-lens system PL and the substrate table WT are accommodated in a housing HO which at the bottom is closed by a base plate BP, made of for example granite, and at the top by the mask table MT.

As is shown in FIG. 1, the mask MA comprises two alignment marks $M_1$ and $M_2$. Suitably, these marks comprise diffraction gratings, but they may alternatively comprise other marks such as squares or strips which optically differ from their environment. The alignment marks are two-dimensional, that is they comprise submarks which extend in two mutually perpendicular directions, the X-direction and the Y-direction in FIG. 1. The substrate W, for example a semiconductor substrate, onto which a plurality of images of the pattern C must be formed adjacent each other, comprises a plurality of align marks, preferably also two-dimensional diffraction gratings, of which two gratings $P_1$ and $P_2$ are shown in FIG. 1. The marks $P_1$ and $P_2$ are situated outside the areas on the substrate W where the images of the pattern C must be formed. Suitably, the grating marks $P_1$ and $P_2$ are phase gratings and the grating marks $M_1$ and $M_2$ are amplitude gratings.

FIG. 2 shows an example of one of the two identical substrate phase gratings to an enlarged scale. Such a grating may comprise four sub-gratings $P_{1,a}$, $P_{1,b}$, $P_{1,c}$ and $P_{1,d}$, of which two sub-gratings $P_{1,b}$ and $P_{1,d}$ serve for alignment in the X-direction and the two other sub-gratings $P_{1,a}$ and $P_{1,c}$ for alignment in the Y-direction. The two sub-gratings $P_{1,b}$ and $P_{1,c}$ have a grating period of, for example, 16 $\mu$m and the sub-gratings $P_{1,a}$ and $P_{1,d}$ have a grating period of, for example, 17.6 $\mu$m. The dimensions of each of the sub-gratings may be, for example, 200×200 $\mu$m. By means of these gratings and a suitable optical system an alignment accuracy of, in principle, less than 0.1 $\mu$m is attainable.

FIG. 3 shows an arrangement in accordance with the invention by means of which this alignment can be effected without the frame of the exposure apparatus or a part of this frame being used as a reference, so that for example thermal instabilities of the frame cannot adversely affect the alignment accuracy. Moreover, this apparatus enables the magnification with which the pattern C is imaged on the substrate W to be controlled.

As FIG. 3 shows, the alignment arrangement comprises two separate and identical alignment systems $AS_1$ and $AS_2$ which are arranged symmetrically relative to the optical axis AA' of the projection-lens system PL. The alignment system $AS_1$ is associated with the mask mark $M_2$ and the alignment system $AS_2$ with the mask mark $M_1$. Corresponding elements of the two alignment systems bear identical reference numerals, the reference numerals of the elements of the system $AS_2$ being primed to distinguish them from those of the system $AS_1$.

The construction of the system $AS_1$ and the manner in which the relative position of the mask mark $M_2$ and the substrate mark $P_1$ is determined by means of this system will now be described first.

The alignment system $AS_1$ comprises a radiation source 1, for example a helium-neon laser, which emits an alignment beam b. A beam splitter 2 reflects this beam to the substrate W. The beam splitter may comprise a semi-transparent mirror or a semi-transparent prism, but suitably comprises a polarisation-sensitive prism followed by a $\lambda/4$ plate 3, where $\lambda$ is the wavelength of the beam b. The projection-lens system PL focuses the beam b to form a small radiation spot V of a diameter of the order of 1 mm onto the substrate W. This substrate reflects a part of the beam as the beam $b_1$ towards the mask M. The beam $b_1$ traverses the projection-lens system PL, which system images the radiation spot V on the mask. Before the substrate is mounted in the exposure apparatus it is so pre-aligned in a pre-alignment station coupled to the arrangement, for example a station as described in European Patent Application No. 0,164,165, that the radiation spot V is situated on the substrate mark $P_1$. This mark is then imaged onto the mask mark $M_2$ by the beam $b_1$. Allowing for the magnification M of the projection-lens system, the dimension of the mask mark $M_2$ is adapted to that of the substrate mark $P_1$, so that in the case of a correct positioning of the two marks relative to each other the image of the mark $P_1$ coincides accurately with the mark $M_2$.

On its way towards and back from the substrate W the beam b, and the beam $b_1$ respectively, has twice traversed the $\lambda/4$ plate 3, the optic axis of this plate extending at an angle of 45° to the direction of polarisation of the linearly polarised beam b issuing from the source 1. The beam $b_1$ traversing the $\lambda/4$ plate then has a direction of polarisation which is rotated through 90° relative to the beam b, so that the beam $b_1$ is transmitted by the polarisation separating prism 2. The use of the polarisation separating prism in conjunction with the $\lambda/4$ plate has the advantage that the alignment beam can be coupled into the radiation path of the alignment system with a minimal loss of radiation.

The beam $b_1$ transmitted by the alignment mark $M_2$ is reflected by a prism 11 and is directed towards a radiation-sensitive detector 13, for example by another reflecting prism 12. This detector is, for example, a composite photodiode comprising, for example, four separate radiation-sensitive areas corresponding to the number of sub-gratings shown in FIG. 2. The output signals of these detectors are a measure of the registration of the mark $M_2$ with the image of the substrate mark $P_1$. These signals can be processed electronically and may be employed to move the mask and the substrate relative to each other by means of drive systems, not shown, in such a way that the image of the mark $P_1$ coincides with the mark $M_2$. Thus, an automatic alignment arrangement is obtained.

A beam splitter 14, for example a semitransparent prism, may be arranged between the prism 11 and the detector 13 to split off a part of the beam $b_1$ so as to form a beam $b_2$. The split-off beam $b_2$ is incident on a television camera 17, for example by two lenses 15 and 16, which camera is coupled to a monitor, not shown, on which the alignment marks $P_1$ and $M_2$ are displayed for the operator of the exposure apparatus. The operator can then establish whether the two marks coincide or can move the substrate W by means of manipulators in order to make the marks coincide.

Figure 4:
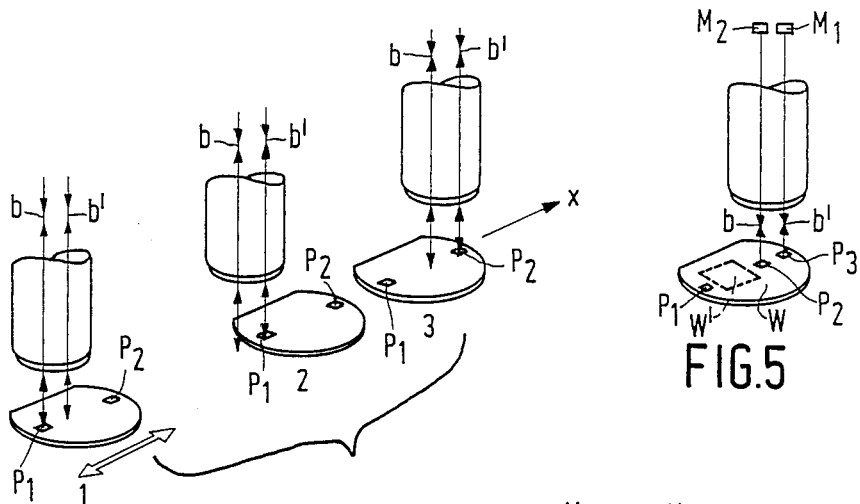

In a way similar to that described above for the marks $M_2$ and $P_1$ the marks $M_1$ and $P_1$ and the marks $M_1$ and $P_2$ can also be aligned relative to one another. For the two last-mentioned alignments the alignment system $AS_2$ is employed. FIG. 4 schematically indicates how the alignment method in accordance with the invention proceeds. The various alignment steps are designated 1, 2 and 3. The alignment systems $AS_1$ and $AS_2$ are represented by their alignment beams b and b'.

Before the substrate W is introduced into the exposure apparatus it has been pre-aligned coarsely, that is within an accuracy of some tens of $\mu m$, in a pre-alignment station in such a way that one of the alignment beams b or b' is incident on one of the substrate marks $P_1$ or $P_2$. It is possible to ensure that first the substrate mark $P_1$ is situated in the radiation path of the system $AS_1$, that is in the beam b, which is position 1 in FIG. 4. By means of the system $AS_1$ and by moving the substrate and the mask relative to each other in the X-direction and the Y-direction the marks $P_1$ and $M_2$ are aligned relative to one another.

The displacement of the substrate and the mask relative to each other is measured with a very accurate two-dimensional displacement system, for example the interferometer system described in U.S. Pat. No. 4,251,160. This system, which is represented schematically in FIG. 1 where it bears the reference IF, cooperates very closely with the alignment systems $AS_1$ and $AS_2$. As the instant at which the alignment system $AS_1$ ascertains that the marks $P_1$ and $M_2$ are aligned correctly, the interferometer system determines where the substrate mark $P_1$ is situated in the coordinate system defined by the interferometer system. The position of the image of the mask mark $M_2$ on the substrate is then known and hence the position in the X-direction and the Y-direction of the local image of the mask pattern C on the substrate.

Subsequently, the substrate mark $P_1$ is brought into the path of the beam b' and the alignment system $AS_2$ is employed to align this mark relative to the mask mark $M_1$, position 2 in FIG. 4. By means of the displacement measuring system it is then established at which angle and over which distance the substrate is displaced in the coordinate system defined by this measuring system, in order to bring the mark $P_1$ in register with the mark $M_1$. This not only gives the angular orientation of the image of the line interconnecting the centres of the mask marks $M_1$ and $M_2$, that is the angular orientation of the mask MA, but the magnification with which the distance between the marks $M_1$ and $M_2$ in the mask is imaged in the substrate plane is then also known. Consequently, it is known with which magnification the mask pattern C is imaged onto the substrate. This information may be employed in order to correct the magnification with which the projection-lens system PL forms an image, for example by adapting the distance between the mask and the lens system. This adaptation will hardly affect the imaging quality.

Finally, the substrate mark $P_2$ is moved into the path of the alignment beam b', position 3 in FIG. 4, and, again by means of the system $AS_2$, the marks $P_2$ and $M_1$ are aligned relative to one another. During this alignment the angular orientation of the substrate, that is the angle between the line interconnecting the centres of the marks $P_1$ and $P_2$ and the X-direction, is determined. During the alignment of the mark $P_2$ relative to the mark $M_1$ the substrate is moved, for example by a combination of a translation and a rotation, so that a possible angular error is eliminated during this alignment. As during the change from position 2 to position 3 the displacement of the substrate is also measured by means of the interferometer system the distance between the substrate marks $P_1$ and $P_2$ is also known. During the repeated imaging of the mask pattern C onto the substrate it is then possible to correct for variations in this distance, which variations may be caused for example, by thermal expansion of the substrate of warping of this substrate.

After the alignment method in accordance with the invention has been performed, the mask and the substrate are not only aligned correctly relative to each other in the X- and Y-direction but an incorrect angular orientation of the line interconnecting the centres of the mask marks relative to the line interconnecting the centres of the substrate marks is also eliminated. Moreover, this provides information on the magnification with which the mask pattern is imaged and on the thermal expansions and deformations of the substrate and the mask, enabling the magnification of the exposure apparatus to be adapted and the system for moving the substrate and the mask relative to each other to be calibrated.

The present alignment method merely employs the marks on the substrate and on the mask as reference in conjunction with the displacement-measuring system. It is not needed to refer to the frame or a part of the frame of the apparatus, so that instabilities of this apparatus hardly affect the alignment accuracy.

Instead of a two-dimensional interferometer system it is also possible to employ another displacement-measuring system, for example a grating measuring system in order to determine the displacement of the substrate. It is merely essential that such a measuring system defines a two-dimensional system of coordinates in the substrate plane and thus a number of reference points in this plane.

It is to be noted that the alignment sequence indicated in FIG. 4 is not essential; it is also possible to use a different sequence or different alignment combination. It is important only that two mask marks are aligned relative to three substrate marks, whilst two of the three substrate marks may be the same marks, as is indicated in FIG. 4.

Figure 5:
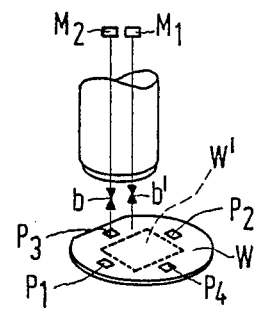

However, it is alternatively possible to employ three separate substrate marks, as is indicated schematically in FIG. 5. One of these marks $P_1$ is situated at one side of the area W' in which a multiple image of the mask pattern is to be formed and the two other marks $P_2$ and $P_3$ are situated at the other side of this area. As is shown in FIG. 5, the two substrate marks $P_2$ and $P_3$ are aligned simultaneously relative to the mask marks $M_2$ and $M_1$, so that in one alignment step four of the above six parameters can be determined. The other two parameters are obtained by moving the substrate in such a way that the mark $P_1$ is situated in register with one of the mask marks $M_2$, $M_1$ and by aligning the mark $P_1$ relative to one of the marks $M_2$, $M_1$. Again use is made of the substrate displacement measuring system.

For imaging the alignment marks onto each other the projection-lens system is employed. However, if the alignment method of FIG. 4 is used the image field of this lens system does not impose any restrictions on the alignment arrangement because always only one mask mark is to be imaged onto one substrate mark. The substrate marks need not be situated simultaneously in the image field of the projection-lens system. As a result of this, it is possible to construct the arrangement in such a way that the two alignment systems $AS_1$ and $AS_2$ can be moved in opposite directions and symmetrically relative to the optical axis AA' of the lens systems PL, as is indicated by the arrows $D_1$ and $D_2$ in FIG. 3. The arrangement may then be used for different types of projection-lens systems having object fields of different sizes and for various masks with different distances between the mask marks.

Instead two or three substrate marks situated outside the projection area W' it is possible to employ four substrate marks situated outside this area and arranged in two pairs, as is shown in FIG. 6. The mark pair $P_1$, $P_2$ can be aligned using the method described with reference to FIG. 4. Furthermore, the additional marks $P_3$ and $P_4$ can be aligned similarly, in which case again one of the mask marks $M_1$, $M_2$ is aligned relative to the two substrate marks and the second mask mark is aligned relative to one of the substrate marks, which is again effected in conjunction with the substrate-displacement measuring system.

The alignment method illustrated in FIG. 6 is advantageous if the substrate exhibits deformations and instabilities which are not circularly symmetrical but which are oriented at an arbitrary angle to the X-axis. The alignment method illustrated in FIG. 6 provides information on these deformations and other irregularities, which information is again employed for controlling the displacements and/or magnifications during the repeated exposure of the substrate via the mask pattern.

So far, only substrate marks situated on the substrate outside the area W' in which the mask pattern is to be imaged repeatedly have been described, said substrate marks being employed to align the mask pattern and the substrate before repeated imaging is started. However, alternatively, it is possible to arrange substrate marks, for example gratings, between the sub-areas $W_d'$ within which each time one mask-pattern image is formed, as is illustrated in FIG. 7. These substrate gratings $P_d$ each comprise two sub-gratings $P_{d,1}$ and $P_{d,2}$ whose grating lines extend in the Y-direction and the X-direction respectively and which serve for alignment in the X-direction and the Y-direction respectively. These gratings need not comprise two sub-gratings with a different grating period for each direction, because the alignment system need only have a very small lock-in range when these gratings are used. The purpose of two sub-gratings for each of the two directions, which sub-gratings have different grating periods, in the grating mark shown in FIG. 2 is to extend the lock-in range of the alignment system.

The substrate gratings $P_d$ between the areas $W_d'$ enable each mask-pattern image to be aligned separately. The method and arrangement described in the foregoing may then be employed, using the same mask marks as employed for the alignment of the substrate marks situated outside the area W'. It is now also possible to correct for local deformations and other irregularities in the substrate.

The accuracy of the arrangement is improved substantially by modulating the output signals of the detectors 13 and 13' with a fixed frequency. For this purpose, as is described in the article in "SPIE", Vol. 470, "Optical Microlethography", III "Technology of the next Decade" 1984, pages 62–69, the mask M and thus, for example, the mask mark $M_2$ may be moved periodically. A better alternative for obtaining a dynamic alignment signal, which is described in U.S. Pat. No. 4,251,160 and which also enables the accuracy of the alignment arrangement in accordance with the invention to be improved, is illustrated in FIG. 3.

Before it reaches the mark $M_2$ the beam $b_1$ has traversed the polarisation-sensitive separating prism 2, so that this beam is linearly polarised and has a specific direction of polarisation. Subsequently, the beam $b_1$ traverses a plate 8 of a bi-refringent material, for example quartz whose optic axis makes an angle of 45° to the direction of polarization of the beam which emerges from the prism 2. Alternatively, the element 8 may comprise a Savart plate or a Wollaston prism. Two beams which are polarised in two mutually perpendicular directions emerge from the plate 8 and at the location of the mask mark $M_2$ they are offset from one another by a specific distance which is dictated by the geometry of the mark $M_2$. When gratings are employed as alignment marks, this distance is equal to half the grating period of the grating $M_2$. The detector 13 is preceded by a polarisation modulator 18 and a polarisation analyser 19. The modulator 18, for example an elasto-optical modulator, is driven by a voltage $V_B$ supplied by a generator 20. As a result of this, the direction of polarisation of the beam emerging from the modulator is alternately shifted through 90°. The analyser 19 has the same principal direction or direction of transmission as the polarisation-sensitive prism 2, so that alternately a first beam and a second beam are transmitted to the detector 13, which first beam has a first direction of polarisation and has formed, for example, a non-shifted image of $P_1$ on $M_2$, and which second beam has a second direction of polarisation and has formed, for example, an image of $P_1$ on $M_2$, which image is shifted by half a grating period. The signal from the detector 13 is amplified and processed in a phasesensitive detection circuit 21, which also receives the signal $V_B$. The output signal $S_A$ then constitutes the desired dynamic alignment signal.

When the alignment marks are gratings substantial advantages can be obtained by arranging a diaphragm in the path of the alignment beam. As is illustrated in FIG. 3, two lenses 10 and 22 may be arranged in the radiation path between the grating mark $M_2$ and the detection system 13. The lens 10 forms an image of the pupil of the projection-lens system PL and a diaphragm 23 is arranged in the plane of this image. The functions of these lenses and of the diaphragm can best be explained with reference to FIG. 8, which schematically shows the principal elements for imaging the gratings $P_1$ and $M_2$ onto the detector 13.

This Figure again shows a projection-lens system PL. This system comprises a large number of lens elements which are not shown separately. The system PL has an exit pupil which, viewed from the mask M, is situated in the plane 25. Consequently, the plane 25 is the plane in which the exit pupil is imaged by the lens elements of the system PL which are situated above this plane.

The beam reflected by the substrate grating $P_1$ is split by this grating into a zero-order beam $b_1(0)$, two first-order subbeams $b_1(+1)$ and $b_1(-1)$, and a plurality of higher-order subbeams which are not shown because they are irrelevant for a correct understanding of the imaging process. All these subbeams together form a faithful image $P_1'$ of the grating $P_1$ in the plane of the mask M. This image is formed by the projection lens system PL. Care is taken that in the case of a correct alignment of the substrate and the mask-pattern image the image $P_1'$ coincides with the grating $M_2$. As is shown in FIG. 8, the subbeams $b_1(0)$, $b_1(+1)$ and $b_1(-1)$, which are diffracted in different diffraction orders, are spatially separated from each other in the plane 25. A diaphragm with apertures at the location of the subbeams $b_1(+1)$ and $b_1(-1)$ may be arranged in this plane, so that the zero-order subbeam and the second-order and higher-order subbeams are suppressed. The zero-order subbeam does not contain any information on the position of the grating $P_1$. Depending on the geometry of the grating, specifically the depth of the grating grooves and the ratio between the width of these grooves and the width of the intermediate strips of the grating, the intensity of this subbeam may be substantial in comparison with the intensity of the first-order subbeam. By suppressing the zero-order subbeam the contrast in the image $P_1'$ can be increased substantially. Since the second-order and higher-order subbeams are suppressed, irregularities in the grating $P_1$ do not affect the alignment signal. If only the first-order subbeams are used the second harmonic of the grating $P_1$ is. In effect, imaged, in other words, when the magnification M of the projection-lens system PL is ignored the image $P_1'$ has a period which is half that of the grating $P_1$. If care is taken that the grating period of the grating $M_2$ is equal to that of the image $P_1'$, that is equal to $\frac{1}{2}M$ times the grating period of the grating $P_1$, the accuracy with which the gratings $M_2$ and $P_1$ are aligned is twice as large as in the case that the entire beam $b_1$ is used for imaging.

In practice, a diaphragm which performs the function described above is arranged outside the projection-lens system PL. This diaphragm can perform its function only if it is arranged in a plane where the subbeams of different diffraction orders are adequately separated. Such a plane is obtained by means of the lens 10 which images the plane 25, which is the plane of the pupil of the system PL, in a plane 25'. The diaphragm 23 is arranged in the last-mentioned plane. The second lens 22, together with the lens 10, ensures that the grating $M_2$ and the image $P_1'$ of the grating $P_1$ which is superimposed thereon is imaged onto the detector 13. The diaphragm has apertures 26 and 27.

As the beam $b_1$ is not filtered before it is incident on the grating $M_2$ it comprises, in principle, all diffraction orders. The grating period of the grating $M_2$ dictates at which angles the subbeams of the various diffraction orders are diffracted by this grating, that is which subbeams issuing from the substrate grating $P_1$ and the mask grating $M_2$ are transmitted to the detector 13. Care has been taken that the components of the first-order subbeams from the grating $P_1$ which are not diffracted by the grating $M_2$, that is the zero-order components of the beams $b_1(+1)$ and $b_1(-1)$, are transmitted. These beam components may be represented by: $b_1(+1,0)$ and $b_1(-1,0)$ in which the second index is the diffraction order of the mask grating $M_2$.

Since the component of the beam $b_1(+1)$ which is diffracted in the +1 order by the grating $M_2$, that is the subbeams $b_1(+1,+1)$, coincides with the subbeam $b_1(-1,0)$, the subbeam $b_1(+1,+1)$, is also transmitted by the aperture 27. The component of the subbeam $b_1(-1)$ diffracted in the −1 order by the grating $M_2$, that is the subbeam $b_1(-1,-1)$, coincides with the subbeam $b_1(+1,0)$, so that the subbeam $b_1(-1,-1)$ is transmitted to the detector 13 by the aperture 26.

All the radiation outside the subbeams $b_1(+1)$ and $b_1(-1)$, which is incident on the grating $M_2$ and which is transmitted by this grating in the zero order, is blocked by the diaphragm 23. This results in a further improvement of the contrast of the image on the detector. The radiation which is incident on the grating $M_2$ and which is diffracted by this grating in the second higher orders is not transmitted by the diaphragm, so that irregularities in the mask grating $M_2$ cannot influence the alignment signal. The part of the zero-order subbeam $b_1(0)$ which issues from the grating $P_1$ and which is diffracted in the +1 order or −1 order by the grating $M_2$ falls outside the apertures 26 and 27, if it can enter the lens 22 at all. It is ensured that the parts of the first-order subbeams which issue from the grating $P_1$ and which are diffracted in the zero-order and the first-orders by the grating $M_2$ are transmitted to the detector, with all the consequent advantages.

It is to be noted that FIG. 8 only illustrates the situation in one plane. As the gratings $P_1$ and $M_2$ are two-dimensional gratings diffraction also occurs in a second plane perpendicular to the plane of drawing in FIG. 8. Therefore, in addition to the apertures 26 and 27 the diaphragm 23 has two further apertures 28 and 29 which in the same way as the apertures 26 and 27 for the first dimension transmit similar diffraction orders for the second dimension.

Since the projection-lens system PL is designed for the wavelength of the projection beam PB, which should be as low as possible in view of the desired high resolution, and alignment is effected with a beam b of a different wavelength, the magnification with which the system PL images the grating $P_1$ may differ slightly from the desired magnification and, moreover, the image of $P_1$ may be situated slightly outside the plane of the mask M. In order to compensate for this a system 4 comprising at least two elements is arranged in the path of the beam $b_1$. The system 4 is shown to an enlarged scale in the bottom-left part of FIG. 3 and comprises three additional mirrors 5, 6 and 7, which prolong the radiation path for the alignment beam $b_1$, and a plano-convex lens 9. The mirrors 5, 6 and 7 together with the mirror 2 may be arranged on a block of a transparent material, for example, glass, on whose bottom surface the λ/4 plate on whose top surface the lens 9 and the birefringent plate 8, Savart plate or Wollaston prism are arranged. The combination of the mirrors 5, 6 and 7 and the lens 9 in conjunction with the projection-lens system PL ensures that he image of the mark $P_1$ has the correct size and is formed at the correct axial position. An alternative to the assembly of mirrors 5, 6 and 7 and the lens 9 may be a combination of a plano-convex lens $4_1$ and a biconvex lens $4_2$, as is shown in broken lines in the bottom-left part of FIG. 3.

It is obvious that what has been said with respect to the generation of a dynamic error signal for the alignment of the marks $M_2$ and $P_1$ by means of the system $AS_1$ the order diaphragm and the wavelength compensation also applies to the alignment by means of the system $AS_2$ of the marks $M_1$ and $P_1$ relative to each other and the marks $M_1$ and $P_2$ relative to each other.

As the alignment arrangement described herein operates independently of the type of pattern C in the mask M the invention may be employed in all cases where a pattern of very fine detail should be transferred to a substrate and this pattern should be aligned very accurately relative to the substrate. Examples of these are apparatuses employed in the fabrication of integrated optical systems of magnetic domain memories. The apparatus with which a pattern is imaged need not be an imaging apparatus of the repeater type; the invention may also be useful in an apparatus in which a pattern is imaged only once on a substrate.

What is claimed is:

1. A method of aligning relative to each other a mask pattern formed in a mask and a substrate on which said mask pattern is to be imaged by a projection lens system, said method using at least two alignment marks present in both the mask and the substrate, said method being practiced by aligning a first substrate mark relative to a first mask mark and by aligning a second substrate mark relative to the first mask mark, said alignments being effected by means of the projection lens system with which the mask pattern is to be imaged onto the substrate, wherein the improvement comprises aligning at least one of said substrate marks relative to the second mask mark using said lens system.

2. A method as claimed in claim 1, wherein the individual alignments are sequential.

3. A method as claimed in claim 2, wherein two additional substrate marks are aligned relative to the two mask marks.

4. A method as claimed in claim 2 wherein substrate marks situated within the substrate area and between sub-areas in each of which one mask pattern is to be imaged are aligned relative to the mask marks.

5. An arrangement for carrying out the method as claimed in claim 1, 2, 3 or 4, which arrangement comprises a first optical alignment system for aligning said first mask mark relative to said substrate marks, which alignment system comprises a radiation source producing an alignment beam, a projection lens system for imaging the first substrate mark and the first mask mark onto each other, and a radiation-sensitive detection system in the path of the alignment beam which has interacted with both the first substrate mark and the first mask mark, the output signal of the detection system being a measure of the position of said alignment marks relative to each other, wherein there is provided a second optical alignment system similar to said first including an associated alignment beam and an associated radiation sensitive detection system in the path of the associated alignment beam, said second alignment system for aligning said second mask mark and said second substrate mark relative to each other, the projection lens system being common to the first and the second alignment systems.

6. An arrangement as claimed in claim 5, wherein the distance between the optical axes of the two alignment systems is variable.

7. An arrangement as claimed in claim 6, wherein the substrate marks comprise phase-diffraction gratings and the mask marks comprise amplitude-diffraction gratings.

8. An arrangement as claimed in claim 7, wherein in each of the optical alignment systems in the radiation path of the alignment beam between the lens projection system and the radiation-sensitive detection system there are arranged means controlled by periodic signals for periodically moving a mask mark observed by the detection system and the image on this mask mark of the substrate mark relative to each other.

9. An arrangement as claimed in claim 8, wherein in each of the optical alignment systems the alignment beam has a radiation path between the mask and the radiation-sensitive detection system which has located in it a second lens system arranged for imaging the pupil of the projection lens system which is common to the two alignment systems, and wherein a diaphragm is arranged in the plane of the pupil image, which diaphragm has apertures at the locations of incidence of beam portions which comprise those components of the first order subbeams issued by one of said substrate gratings which are diffracted in the zero and first orders by an associated mask grating.

10. An arrangement as claimed in claim 9, wherein in each of the optical alignment systems in the radiation path of the alignment beam between the projection lens system common to the two alignment system and one of said mask marks an optical correction element is arranged for correcting the size and the axial position of the substrate-mark image formed by the projection lens system.

11. An arrangement as claimed in claim 5, wherein the substrate marks comprise phase-diffraction gratings and the mask marks comprise amplitude-diffraction gratings.

12. An arrangement as claimed in claim 5, wherein in each of the optical alignment systems in the radiation path of the alignment beam between the lens projection system and the radiation-sensitive detection system there are arranged means controlled by periodic signals for periodically moving a mask mark observed by the detection system and the image on this mask mark of the substrate mark relative to each other.

13. An arrangement as claimed in claim 6, wherein in each of the optical alignment systems in the radiation path of the alignment beam between the lens projection system and the radiation-sensitive detection system there are arranged means controlled by periodic signals for periodically moving a mask mark observed by the detection system and the image on this mask mark of the substrate mark relative to each other.

14. An arrangement as claimed in claim 5, wherein in each of the optical alignment systems the alignment beam has a radiation path between the mask and the radiation-sensitive detection system which has located in it a second lens system arranged for imaging the pupil of the projection lens system which is common to the two alignment systems, and wherein a diaphragm is arranged in the plane of the pupil image, which diaphragm has apertures at the locations of incidence of beam portions which comprise those components of the first order subbeams issued by one of said substrate gratings which are diffracted in the zero and first orders by an associated mask grating.

15. An arrangement as claimed in claim 6, wherein in each of the optical alignment systems the alignment beam has a radiation path between the mask and the radiation-sensitive detection system which has located in it a second lens system arranged for imaging the pupil of the projection lens system which is common to the two alignment systems, and wherein a diaphragm is arranged in the plane of the pupil image, which diaphragm has apertures at the locations of incidence of beam portions which comprise those components of the first order subbeams issued by one of said substrate gratings which are diffracted in the zero and first orders by an associated mask grating.

16. An arrangement as claimed in claim 7, wherein in each of the optical alignment systems the alignment beam has a radiation path between the mask and the radiation-sensitive detection system which has located in it a second lens system arranged for imaging the pupil of the projection lens system which is common to the two alignment systems, and wherein a diaphragm is arranged in the plane of the pupil image, which diaphragm has apertures at the locations of incidence of beam portions which comprise those components of the first order subbeams issued by one of said substrate gratings which are diffracted in the zero and first orders by an associated mask grating.

17. An arrangement as claimed in claim 5, wherein in each of the optical alignment systems in the radiation path of the alignment beam between the projection lens system common to the two alignment system and one of said mask marks an optical correction element is arranged for correcting the size and the axial position of the substrate-mark image formed by the projection lens system.

18. An arrangement as claimed in claim 6, wherein in each of the optical alignment systems in the radiation path of the alignment beam between the projection lens system common to the two alignment system and one of said mask marks an optical correction element is arranged for correcting the size and the axial position of the substrate-mark image formed by the projection lens system.

19. An arrangement as claimed in claim 7, wherein in each of the optical alignment systems in the radiation path of the alignment beam between the projection lens system common to the two alignment system and one of said mask marks an optical correction element is arranged for correcting the size and the axial position of the substrate-mark image formed by the projection lens system.

20. An arrangement as claimed in claim 8, wherein in each of the optical alignment systems in the radiation path of the alignment beam between the projection lens system common to the two alignment system and one of said mask marks an optical correction element is arranged for correcting the size and the axial position of the substrate-mark image formed by the projection lens system.

* * * * *